(12) United States Patent
Mueller et al.

(10) Patent No.: US 7,851,696 B2
(45) Date of Patent: Dec. 14, 2010

(54) SOLAR CELL

(75) Inventors: Joerg Mueller, Sandersdorf (DE); Robert Wade, Leipzig (DE); Markus Hlusiak, Wolfen (DE)

(73) Assignee: Q-Cells SE, Bitterfeld-Wolfen (DE)

( * ) Notice: Subject to any disclaimer, the term of this patent is extended or adjusted under 35 U.S.C. 154(b) by 0 days.

(21) Appl. No.: 12/627,482

(22) Filed: Nov. 30, 2009

(65) Prior Publication Data

US 2010/0071758 A1    Mar. 25, 2010

Related U.S. Application Data

(63) Continuation of application No. 12/517,935, filed as application No. PCT/EP2007/063537 on Dec. 7, 2007.

(30) Foreign Application Priority Data

Dec. 8, 2006    (DE) .................. 10 2006 058 267

(51) Int. Cl.
    *H01L 31/00*    (2006.01)
    *H01L 21/00*    (2006.01)
(52) U.S. Cl. .................. 136/252; 136/255; 136/258; 136/261; 438/97
(58) Field of Classification Search .................. 136/252, 136/255, 258, 261; 438/97
    See application file for complete search history.

(56) References Cited

U.S. PATENT DOCUMENTS 3,903,428 A    9/1975    DeJong 4,626,613 A    12/1986    Wenham et al.
7,144,751 B2    12/2006    Gee et al.
2005/0176164 A1*    8/2005    Gee et al. .................. 438/48

(Continued)

FOREIGN PATENT DOCUMENTS

DE    34 46 885 A1    7/1985

(Continued)

OTHER PUBLICATIONS

L. Mai et al., New Emitter Design and Metal Contact for Screen-Printed Solar Cell Front Surfaces, 4. WC-PEC Hawaii 2006.

(Continued)

*Primary Examiner*—Jennifer K Michener
*Assistant Examiner*—Eli S Mekhlin
(74) *Attorney, Agent, or Firm*—Workman Nydegger

(57) ABSTRACT

The invention relates to a solar cell that comprises a planar semiconductor substrate with a front and a back; a multitude of holes that interconnect the front and the back; and current-collecting electrical contacts that are exclusively arranged on the back. The front comprises highly doped regions and lightly doped regions of a first type such that in each case the holes are situated in a highly doped region or adjoin such a region. According to a first aspect of the invention, the highly doped regions are arranged locally around the holes. According to a second aspect of the invention, the front comprises at least one region without holes, and the highly doped regions comprise one region or several regions that extends/extend to the at least one hole-free region. The invention furthermore relates to methods for manufacturing such solar cells.

20 Claims, 4 Drawing Sheets

U.S. PATENT DOCUMENTS

| | | |
|---|---|---|
| 2009/0007962 A1 | 1/2009 | Wenham et al. |
| 2009/0008787 A1 | 1/2009 | Wenham et al. |
| 2009/0183768 A1 | 7/2009 | Wenham et al. |

FOREIGN PATENT DOCUMENTS

| | | |
|---|---|---|
| WO | 2006/130910 A1 | 12/2006 |
| WO | 2007/059551 A1 | 5/2007 |
| WO | 2007/059577 A1 | 5/2007 |
| WO | 2007/059578 A1 | 5/2007 |

OTHER PUBLICATIONS

S.R. Wenham et al., Innovative Emitter Design and Metal Contact for Screen-Printed Solar Cells, 15 PVSEC Shanghai 2005.

James M. Gee, et al "Emitter Wrap-Through Solar Cell" Proceedings of the Photovoltaic Specialists Conference Louisville, May 10-14, 1993; New York: IEEE, US, Bd. Conf. 23, May 10, 1993, pp. 265-270, XP-010113396, ISBN: 978-0-7803-1220-3.

Neu, W et al "Low-cost multi-crystalline back-contact silicon solar cells with screen printed metallization" Solar Energy Materials and Solar Cells, Elseviewr Science Publishers; Amsterdam, NL, Bd. 74, Nr. 1-4, Oct. 1, 2002, pp. 139-146, XP-004376936; ISSN: 0927-0248.

Kress, A et al "Investigations on low-cost back-contact silicon solar cells" Solar Energy Materials and Solar Cells, Elsevier Science Publishers, Amsterdam, NL, Bd. 65, Nr. 1-4, Jan. 1, 2001, pp. 555-560, XP-0042171655, ISSN: 0297-0248.

Schoenecker, A et al "An industrial multi-crystallien EWT solar cell with screen printed metallisation", 14th. E.C. Photovoltaic Solar Energy Conference, Barcelona, Spain, Jun. 30-Jul. 4, 1997, (Proceedings of the International Photovoltaic Solar Energy Conference) Bedford: H.C. Stephens & Associates, GB, Bd. Conf. 14, Jun. 30, 1997, pp. 796-700, XP-001136170, ISBN: 978-1-901675-03-0.

\* cited by examiner

SOLAR CELL

CROSS-REFERENCE TO A RELATED APPLICATION

This application is a Continuation of U.S. patent application Ser. No. 12/517,935, which is a National Phase Patent Application of International Patent Application Number PCT/EP2007/063537, filed on Dec. 7, 2007, which claims priority of German Patent Application Number 10 2006 058 267.5, filed on Dec. 8, 2006.

BACKGROUND

The invention relates to a solar cell and to a method for manufacturing a solar cell.

An Emitter-Wrap-Through (EWT) solar cell does not comprise any metallization at the front. The emitter is conducted to the cell back by way of a multitude of small holes (d<100 µm) and is contacted at the cell back. The light-generated current is conducted, by way of the emitter and the holes, to contacts that are arranged on said cell back and is tapped there.

The extent of emitter doping plays an important part. Higher doping results on the one hand in lower layer resistance and thus contributes to a reduction in ohmic losses. Furthermore, the contact resistance between the emitter and the metallization is significantly reduced with high emitter doping. High doping on the other hand reduces the ability of the cell to convert in particular shortwave light into current (so-called blue-sensitivity). Accordingly, a compromise between good conductivity and blue-sensitivity must be selected for doping.

In order to reduce the effective layer resistance of an EWT solar cell it is known, for example, from US 2005/0176164 A1 to carry out higher doping in the interior wall of the holes of the cell than on the front of the cell. Such a concept is also referred to as a selective emitter or selective doping. From US 2005/0176164 A1 it is furthermore known (FIG. 3D of this printed publication), at the front of an EWT solar cell, to form a highly doped strip that comprises several of the holes.

U.S. Pat. No. 7,144,751 B1 describes a solar cell in which there is higher doping in the interior wall of the holes of the solar cell and along a grid at the front of the solar cell.

It is the object of the present invention to provide a solar cell with low effective layer resistance while at the same time featuring high blue-sensitivity, and to provide a method for manufacturing such a solar cell.

SUMMARY

According to an aspect of the invention there is provided a solar cell with a multitude of holes in which the front comprises highly doped regions and lightly doped regions of a first doping type such that in each case the holes of the solar cell are situated in a highly doped region or adjoin such a region. In this arrangement the highly doped regions are arranged locally around the holes of the solar cell. The individual, local, highly doped regions are spatially separated from each other and thus do not form a connected structure at the front of the solar cell. It is thus intended that the front emitter does not comprise homogeneous doping, but instead that it is highly doped in the immediate surroundings of the holes. As a result of this special doping the predominant part of the front, which part is lightly doped, comprises an emitter with high blue-sensitivity. As a result of the highly doped regions, at the same time the series resistance and the contact resistance are reduced.

Among other things the extent of doping of the regions of the front in direct proximity to the holes is decisive for the series resistance of a solar cell. This is due to the fact that the current in these regions flows almost radially towards the hole, and thus in these regions the highest current density occurs. Thus if the peripheral region of the holes is highly doped, the disadvantageous electrical resistance is reduced. The peripheral region of the holes that is highly doped comprises, for example, a radius of some 100 µm.

The solar cell according to an exemplary embodiment of the invention is, for example, an EWT solar cell or a Metallization Wrap-Through (MWT) solar cell.

In one exemplary embodiment of the invention the front forms highly doped regions that are essentially circular in shape. In this arrangement it can be provided for the highly doped regions to form a circular ring with an internal radius and an external radius, wherein the internal radius corresponds to the radius of the hole that is surrounded by the respective circular ring. The difference in radius between the external radius and the internal radius is, for example, between 50 µm and 300 µm, in particular between 100 µm and 200 µm.

In another exemplary embodiment the front forms highly doped regions that radiate in a star-shaped manner or fan-shaped manner from the respective holes. In this arrangement the highly doped regions that radiate from the respective holes in a star-shaped manner or fan-shaped manner in one embodiment in each case comprise finger-shaped regions.

According to a further aspect of the invention there is provided a solar cell in which the semiconductor substrate, and thus the front of the solar cell, comprises regions without holes. There can be various reasons for this. For example there are certain regions of the solar cell where holes are undesirable. This applies in particular to regions where holes are not possible on the back, for example because in those regions soldering locations or busbars with the base polarity of the semiconductor substrate have been implemented or because these are edge regions of the cell. Furthermore, for technological reasons it is desirable to keep the number of holes as small as possible. Such technological reasons include, for example, the necessity to drill the holes, or the number of contact fingers and busbars on the back. On the other hand in order to achieve a low series resistance it is advantageous to provide the greatest possible number of holes. Consequently, for example in EWT solar cells, it is always necessary to reach a compromise in relation to the number of holes. To the extent that a low series resistance can be achieved even with a comparatively small number of holes, as is the case in the present invention, the holes can comprise relatively large spacing from each other, so that larger areas without holes are situated between the holes.

In such hole-free regions the distance to the next hole, and thus the current path on the front, is significantly larger than desired. This results in a large parasitic electrical series resistance in these regions. This further aspect of the invention now provides for the highly doped regions of the front to comprise regions that extend into the hole-free regions. These are, for example, finger-shaped regions that extend in a fan-shape into the hole-free regions. These finger-shaped highly-doped regions are well-conducting current paths that convey the current that has been collected in the hole-free regions to a hole. As a result of this the finger-shaped highly doped regions reduce the series resistance. At the same time their transparency ensures good utilisation of light.

In one exemplary embodiment the highly doped regions overall, and in particular the finger-shaped regions that extend into hole-free regions, can be formed in channels in the semiconductor substrate.

A method according to an embodiment of the invention for manufacturing an Emitter-Wrap-Through (EWT) solar cell comprises the following steps:

provision of a planar semiconductor substrate with a front and a back;

application of a diffusion mask over the entire surface area, at least to the front;

fabrication of a multitude of holes in the semiconductor substrate, which holes interconnect the front and the back;

selective removal of the diffusion mask such that the diffusion mask is removed at least in the regions where the holes are located or to which the holes adjoin;

carrying out strong diffusion with a dopant of a first type, wherein the regions of the front in which the diffusion mask was selectively removed are highly doped;

complete removal of the diffusion mask at least from the front;

carrying out light diffusion with a dopant of the first type.

It is not mandatory for these process steps to be fully carried out in the order indicated. For example, it can be provided for the holes to be made only after selective removal of the diffusion mask, or even prior to the application of the diffusion mask.

A further method according to an embodiment of the invention for producing an Emitter-Wrap-Through (EWT) solar cell provides for the following steps to be taken:

provision of a planar semiconductor substrate with a front and a back;

fabrication of a multitude of holes in the semiconductor substrate, which holes interconnect the front and the back;

carrying out strong diffusion with a dopant of a first type at least on the front, wherein the entire front is highly doped;

application of a diffusion mask over the entire surface area, at least to the front;

selective removal of the diffusion mask such that the diffusion mask is left in place only in defined regions where the holes are located or to which the holes adjoin; followed by removal of the regions that are highly doped in strong diffusion in the regions of the front, which regions are located outside the diffusion mask; and carrying out light diffusion with a dopant of the first type, at least on the front;

complete removal of the diffusion mask, at least from the front.

In this method variant, first the front is thus highly doped over the entire surface area. The diffusion mask is structured so that it is complementary to the diffusion mask of the method of claim 24. Outside the structured diffusion mask the high doping is removed. This is followed by low doping in these regions. Finally, this is followed by the complete removal of the diffusion mask, at least from the front.

BRIEF DESCRIPTION OF THE DRAWINGS

Below, the invention is explained in more detail with reference to the figures of the drawing with reference to their exemplary embodiments. It is understood that these figures illustrate only typical embodiments of the invention and are therefore not to be interpreted as limiting the scope of the invention. The following are shown.

DETAILED DESCRIPTION

Figure 1:
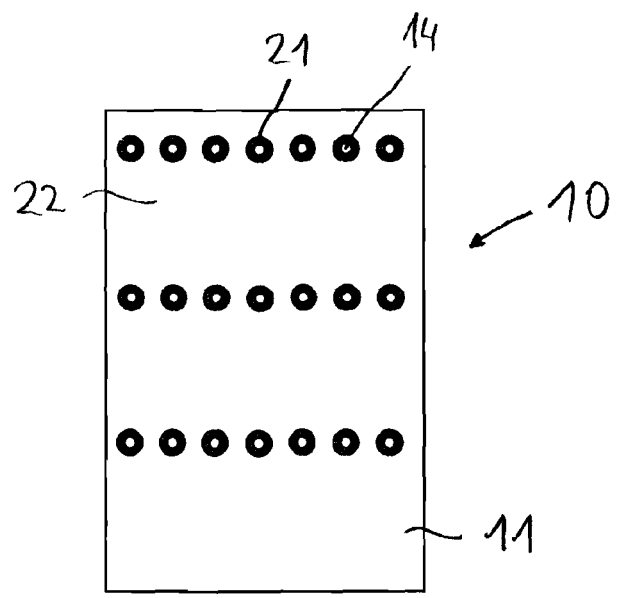
FIG. 1 the top of an EWT solar cell with locally formed highly doped regions.
Figure 2:
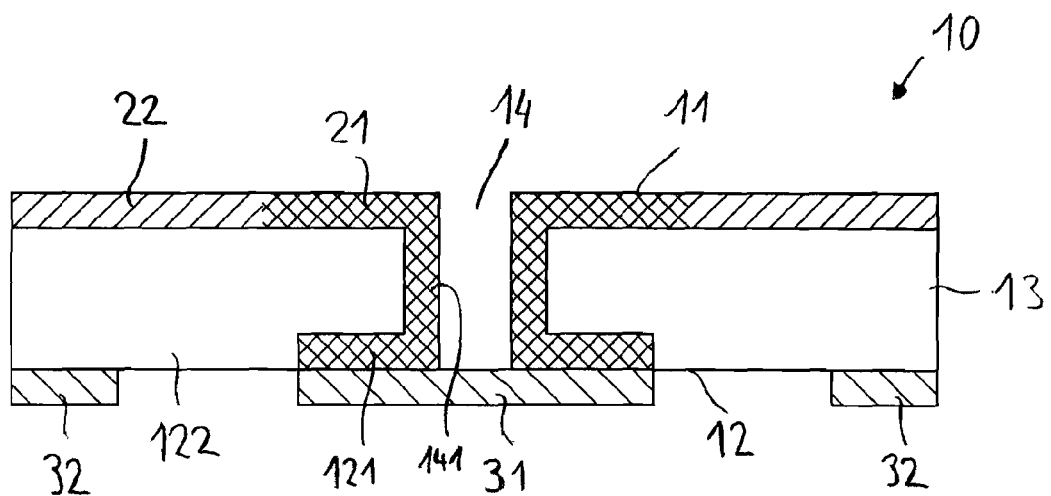
FIG. 2 a section of a sub-region of the EWT solar cell according to FIG. 1.

FIGS. 1 and 2 show an EWT solar cell with highly doped regions that are selectively arranged at the top. The solar cell 10 comprises a semiconductor substrate 13, for example a silicon wafer, with a top 11 and a bottom 12. In the semiconductor substrate a multitude of through-holes 14 are formed that interconnect the top 11 and the bottom 12. The holes 14 are arranged in a grid-like manner, wherein the spacing between two holes in one direction is between 0.2 and 0.8 mm, while in the direction perpendicularly to it, the spacing is for example 2 mm. The hole diameters are typically between 30 and 100 μm.

The holes 14 are, for example, produced by laser drilling. However, other production methods such as e.g. etching processes or mechanical drilling processes are also imaginable.

The front 11 of the semiconductor substrate 13 comprises doping of a first type, for example n-doping. The semiconductor substrate 13 itself also comprises doping, namely of a second, opposite, type, for example p-doping. For the sake of simplicity, hereinafter the terms n-doping and p-doping are used, even if doping can obviously in each case also be the other way round.

N-doping is effected at the front 11 and extends through the interior walls of the holes 14 through to the bottom 12 of the semiconductor substrate 13. Apart from comprising the n-doped regions 121, the bottom 12 comprises further, second, regions 122 that comprise p-doping. This is the p-doping of the semiconductor substrate 13 which, if necessary, can be locally reinforced by additional doping.

The n-doped regions 121 of the bottom 12 are connected to first electrical contacts 31 in the form of a finger contact. The p-doped regions 122 of the bottom 12 are connected to second electrical contacts 32, also in the form of a finger contact. The electrical contacts 31, 32 are electrically insulated from each other, for example by means of a diffusion barrier (not shown).

In the EWT cell concept shown, the contacts for both poles are situated on the back of the cell. The n-doped emitter region is led through many of the tiny holes in the cell from the front to the back, and is contacted only on the back.

It should be pointed out that FIGS. 1 and 2 do not show all the elements of a complete EWT solar cell. Only those elements are shown that are necessary to provide an understanding of the present invention. For example, the average person skilled in the art knows that apart from the elements shown, for the purpose of reducing reflections an EWT solar cell can comprise texturing or one or several passivation layers on the top 11, for example a $SiN_x$ layer. Furthermore, it is also possible for passivation layers and/or diffusion barriers for electrically separating the first from the second electrical contacts 31, 32 to be provided at the back 12. The provided electrical contacts 31, 32 can, for example, comprise aluminium and silver or can comprise exclusively silver. These are only some examples of further embodiments that the EWT solar cells can comprise.

It is now provided for the front 11, which forms the emitter, to comprise local highly doped regions 21 adjacent to the holes 14, which regions 21 thus, for example, comprise n++ doping. These highly doped regions 21 are, for example, in the shape of a circular ring, as shown in FIG. 1. However, they can also assume other shapes, for example they can be designed so as to be star-shaped or spiral-shaped. In this arrangement the highly doped regions 21 are local in the sense that they do not contact each other and do not overlap each other.

In contrast to the above, outside these regions in the remaining surface region 22 the surface is slightly doped (n+ doping). In the highly doped regions 21 the layer resistance is preferably less than 30 Ohms/sq, preferably less than 15 Ohms/sq and in a preferred embodiment approximately 5 Ohms/sq. In the region of the remaining surface 22 there is slight doping with a layer resistance of, for example, more than 80 Ohms/sq.

Figure 3:
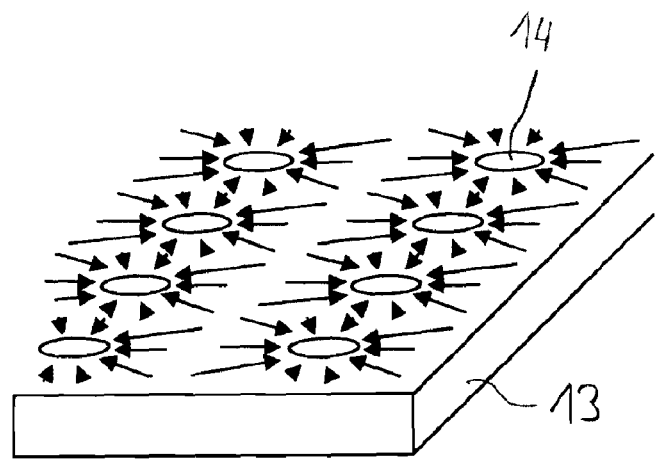
FIG. 3 diagrammatically the current flow on the front of an EWT solar cell.

FIG. 3 shows that due to the fact that the current flows approximately radially to a hole 14 the current density increases as the distance to the hole 14 decreases, so that in the surrounding region of a hole 14 the highest current density occurs. By highly doping this peripheral region of the holes 14, the layer resistance of the EWT solar cell is reduced. At the same time the predominant part 22 of the front 11 comprises an emitter with slight doping, and correspondingly with high blue-sensitivity (i.e. a good ability to convert shortwave light into current).

Figure 4:
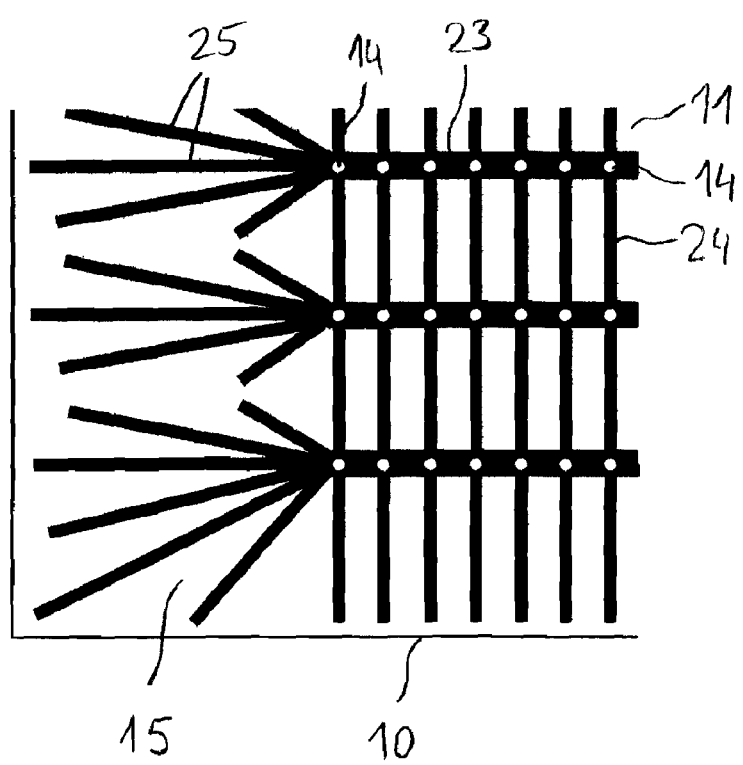
FIG. 4 a top view of a further exemplary embodiment of an EWT solar cell with locally highly doped regions.

FIG. 4 shows an alternative exemplary embodiment of an EWT solar cell in which on the top 11 of the solar cell certain local regions are highly doped. To this effect, in the exemplary embodiment shown in FIG. 4, highly doped regions 23 that are arranged in lines, highly doped regions 24 that are arranged in rows, and elongated finger-shaped narrow regions 25 are provided. At the intersecting points between the highly doped lines and the columns 23, 24 the holes 14 are arranged, so that the front in the direct surrounding of the holes 14 is highly doped, as is the case in the exemplary embodiment of FIGS. 1 and 2.

Starting from a hole 14, the fingers 25 extend in a fan-shape to a hole-free region 15. Such a hole-free region arises, for example, in that at the back there is a busbar, a soldering location or similar (compare also FIG. 7), and thus in this region it is not possible to have any holes. However, this results in the hole-free region 15 comprising large spacing to the next hole 14. In a disadvantageous manner this large spacing can lead to high parasitic electrical series resistance. By forming highly doped fingers 25 a situation is achieved in which the line carriers created in the hole-free region 15 can be conducted by way of well-conducting current paths to the holes 14 and from them to the cell back 11 to the corresponding contacts 31, 32.

Corresponding fingers can, for example, also be formed at edge regions of the solar cell 10, or in each case between two holes 14 of a grid if there is a small number of holes in the solar cell and if the grid is correspondingly large. It should also be pointed out that corresponding fingers that extend into hole-free regions can be implemented in combination with the embodiment of FIG. 1.

The fingers 25 comprise, for example, a width that is less than or equal to 50 μm. In one embodiment the fingers 25 comprise a variable width, wherein they preferably taper off towards their ends that face away from their associated hole.

It should be pointed out that the embodiments of FIGS. 1, 2 and 4 are to be interpreted only as examples. The highly doped regions can also comprise other geometries, for example they can be arranged around the individual holes in a rectangular or oval manner. Moreover, the finger-like regions 25 can, for example, comprise in each case only one finger that is designed either straight or curved (including in a spiral shape).

Figure 5:
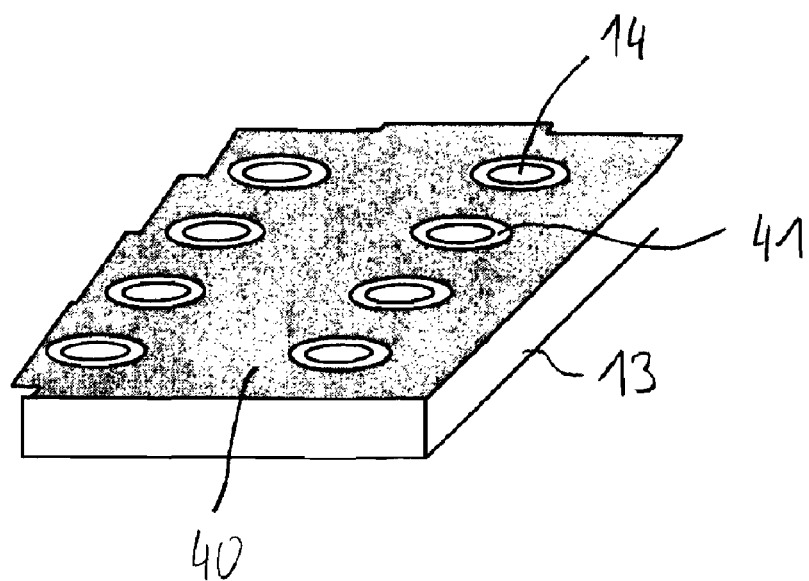
FIG. 5 a diffusion mask, applied to a semiconductor substrate, for masking a strong diffusion, wherein the diffusion mask in the region of holes of the semiconductor substrate comprises circular local recesses.
Figure 6:
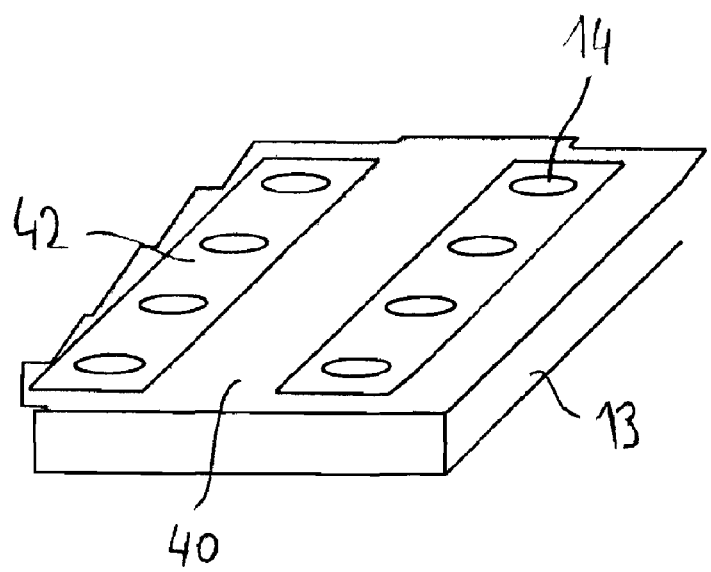
FIG. 6 a diffusion mask, applied to a semiconductor substrate, for masking a strong diffusion, wherein the diffusion mask in a line-shaped arrangement comprises recesses, each comprising a row of holes.

In order to produce the highly doped regions on the top 11 of the solar cells the application of a diffusion mask on the semiconductor substrate 13 is provided, as is structuring of this diffusion mask. FIG. 5 shows a diffusion mask 40 that has been applied to the semiconductor substrate 13, which diffusion mask 40 comprises circular local recesses 41 in the region of the holes 14. FIG. 6 shows a diffusion mask 40, applied to the semiconductor substrate 13, which diffusion mask 40 comprises line-shaped or strip-shaped recesses 42, each comprising a row of holes. In each case the mask 40 serves to mask a strong diffusion, for example with phosphorus. In this arrangement the mask shown in FIG. 6 is easier to produce than the mask shown in FIG. 5, but it results in a less efficient EWT solar cell due to its reduced blue-sensitivity.

A mask according to FIG. 5 or 6 is, for example, produced in that first a diffusion mask 40 is applied, over the entire surface area, to the semiconductor substrate 13. To this effect the semiconductor substrate 13 is, for example, oxidised so that an $SiO_2$ layer arises. However, a diffusion barrier can also be produced in other ways.

The diffusion mask 40, which for example comprises silicon oxide, comprises a thickness of, for example, 200 nm. This layer is not penetrated by the dopants within the normal diffusion conditions: since oxide impedes diffusion, the natural surface oxide has an interfering effect, thus preventing an even penetration of the dopant in the silicon crystal.

The diffusion mask 40 is applied at least to the front of the solar cell, preferably, however, both to the front and the back.

Prior to, or after, the holes are made (preferably after the holes are made), selective removal of the diffusion mask takes place in the sub-regions 41 or 42 of FIGS. 5 and 6. Selective removal of the diffusion mask in these regions can take place in various ways.

To this effect a first embodiment provides for the application of an etching paste in the corresponding regions on the front. In the embodiment of FIG. 5 the etching paste is applied in round regions 41, each of which comprises a hole 14. In the embodiment of FIG. 6 the etching paste is applied in a strip-shaped manner, wherein each strip 42 comprises a row of holes. The etching paste removes the diffusion mask in the regions where it has been applied.

In a second exemplary embodiment the removal of the mask material in the regions 41, 42 mentioned takes place by means of laser ablation. A line-shaped or point-shaped laser spot is used.

In a third embodiment the diffusion mask is etched through a structured etching layer. The structured etching layer is, for example, applied by screen printing, by an inkjet process or by dispensing.

A fourth embodiment variant makes use of capillary action. In this process the bottom 12 of the solar cell 10 is immersed in an etching solution. Due to capillary action the etching solution is drawn through the holes 14 to the front 11. In this process a local region around the holes 14 is etched, wherein some etching solution flows from the holes, and/or etching takes place as a result of the vapour of the solution.

Following the selective removal of the diffusion mask 40 in the sub-regions 41, 42 of the front, a strong diffusion of a doping agents takes place. For example, the strong diffusion takes place with the use of phosphorous. To this effect it can be provided for the diffusion to take place in the flow-through method, wherein a carrier gas (Ar, $N_2$) from a source is enriched to the desired extent with dopant and is fed to a quartz tube in which the semiconductor substrate is located. For example $PH_3$ is used as a dopant source. As an alternative, a liquid dopant source, for example $POCl_3$, is used. The respective liquid is then located in a temperature controlled bubbler vessel through which the carrier gas flows. The dopant reaches the quartz tube for diffusion together with the carrier gas.

Likewise, it is, for example, possible to carry out strong diffusion by way of a printed-on diffusion paste, as is, for example, described in US 2005/07 61 64 A1.

After the strong diffusion has been carried out, the diffusion mask 40 is completely removed from the cell front 11. Subsequently, light diffusion takes place for providing lightly doped regions on the front of the solar cell. The light diffusion takes place, for example, also with the use of phosphorus.

The above is followed by further processes such as passivation processes, processes to provide structuring of the top, and processes to produce positive and negative contacts on the back of the solar cell in corresponding regions. These further steps are well known per se to the average person skilled in the art, so that they are not discussed in further detail in the present document.

Figure 7:
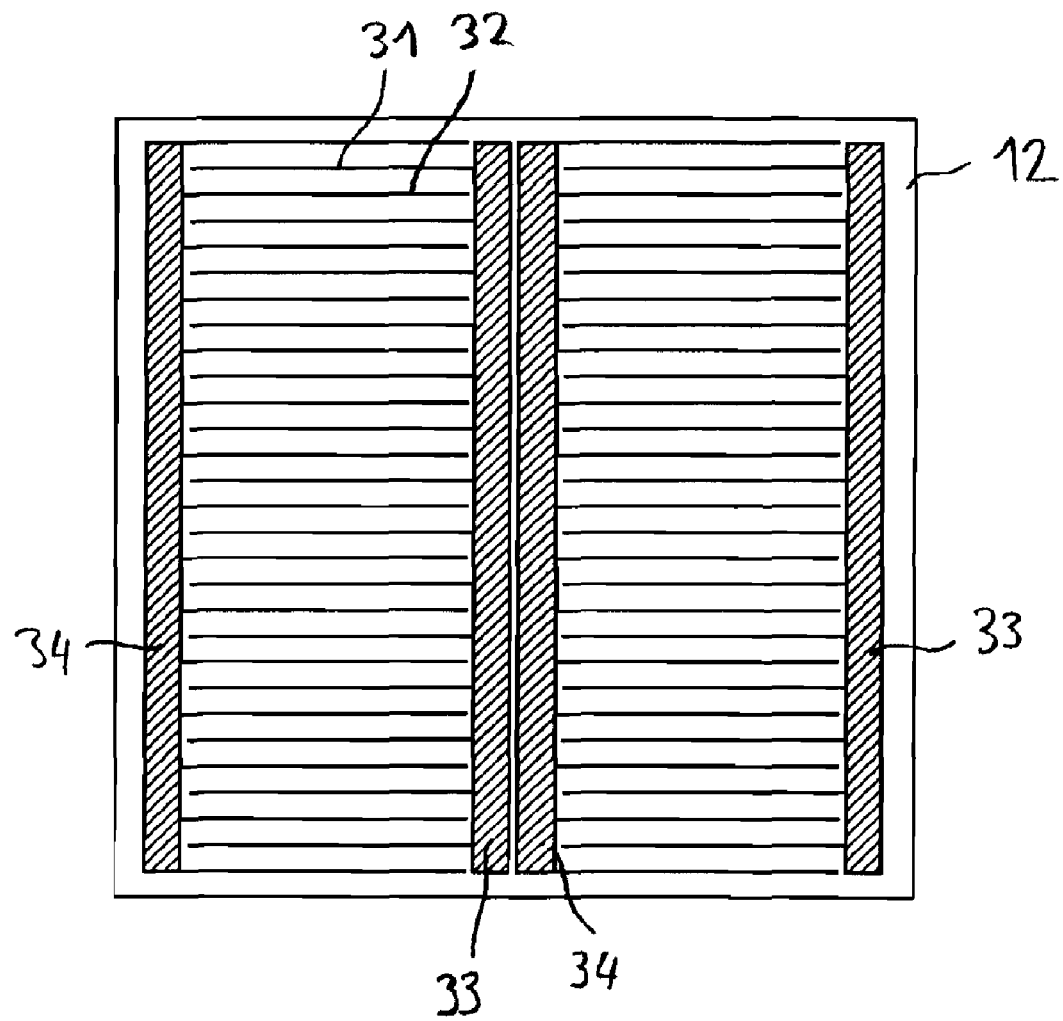
FIG. 7 a structure, known from the state of the art, of current-collecting electrical contacts on the back of an EWT solar cell.

FIG. 7 shows a typical structure of a current-collecting back contacting arrangement of an EWT solar cell. The back comprises first finger contacts 31 with a positive polarity, second finger contacts 32 with a negative polarity, and a total of four busbars 33, 34, of which two have the same polarity. The currents collected by way of the finger contacts 31, 32 are tapped from the solar cell by way of the busbars 33, 34.

The invention claimed is:

1. A solar cell comprising:
    a planar semiconductor substrate with a front and a back;
    a multitude of holes that interconnect the front and the back; and
    current-collecting electrical contacts that are exclusively arranged on the back; wherein
    the front comprises doping of a first type;
    the interior wall of the holes comprises doping of the first type or metallization;
    the back comprises first regions that comprise the holes and that comprise doping of the first type, as well as second regions that comprise doping of a second type;
    the current-collecting electrical contacts comprise first contacts that contact the first regions of the back, and second contacts that contact the second regions of the back;
    the front comprises highly doped regions of the first type and lightly doped regions of the first type in such a way that in each case the holes are situated in a highly doped region or adjoin such a region, and
    the front of the planar semiconductor substrate comprises at least one region without holes, whereby the highly doped regions of the front comprise one or several regions that extend to the at least one region without holes.

2. The solar cell according to claim 1, wherein the highly doped regions of the front comprise one or several finger-shaped regions that extend into the at least one hole-free region.

3. The solar cell according to claim 2, wherein in each case the finger-shaped regions are designed in a straight line.

4. The solar cell according to claim 2, wherein at least some of the finger-shaped regions comprise a variable width.

5. The solar cell according to claim 4, wherein the finger-shaped regions taper off towards their ends.

6. The solar cell according to claim 1, wherein a multitude of finger-shaped regions, starting from a hole, extend in a fan-shaped manner into a hole-free region.

7. The solar cell according to claim 1, wherein the finger-shaped regions comprise a width of $\leq 50$ μm.

8. The solar cell according to claim 1, wherein the finger-shaped regions are formed in channels of the semiconductor substrate.

9. The solar cell of claim 1, wherein the lightly doped regions of the front comprise a layer resistance of $\geq 80$ Ohms/sq.

10. The solar cell of claim 1, wherein the highly doped regions comprise a layer resistance of less than or equal to 30 Ohms/sq.

11. The solar cell claim 1, wherein the highly doped regions are formed in channels that are formed on the semiconductor substrate.

12. The solar cell of claim 1, wherein the interior walls of the holes are also highly doped.

13. The solar cell of claim 1, wherein the regions of the doping of the first type, which regions are arranged on the back, are also highly doped.

14. The solar cell of claim 1, wherein doping of the first type is n-doping, and doping of the second type is p-doping, or vice versa.

15. The solar cell of claim 1, wherein the semiconductor substrate is a p-doped or n-doped monocrystalline or polycrystalline silicon substrate.

16. The solar cell of claim 1, wherein the first electrical contacts and the second electrical contacts form two interlocking combs on the back of the solar cell.

17. The solar cell of claim 1, wherein the holes are arranged in a grid, wherein the spacing between two holes in one direction is between 0.2 and 0.8 mm, while in the direction perpendicularly to it the spacing is between 1 mm and 2.5 mm.

18. A solar cell comprising:
    a planar semiconductor substrate with a front and a back;
    a multitude of holes that interconnect the front and the back; and
    current-collecting electrical contacts that are arranged on the back; wherein
    the front comprises highly doped regions of a first type and lightly doped regions of the first type,
    at least some of the holes are each situated in such highly doped region or adjoin such highly doped region,
    the front of the planar semiconductor substrate comprises at least one region without holes, and
    the highly doped regions of the front comprise one or several regions that extend to the at least one region without holes.

19. The solar cell according to claim 18, wherein the highly doped regions of the front comprise one or several finger-shaped regions that extend into the at least one hole-free region.

20. The solar cell according to claim 18, wherein a multitude of finger-shaped regions, starting from a hole, extend in a fan-shaped manner into a hole-free region.

* * * * *